United States Patent [19]
Hutter et al.

[11] Patent Number: 5,171,699
[45] Date of Patent: Dec. 15, 1992

[54] VERTICAL DMOS TRANSISTOR STRUCTURE BUILT IN AN N-WELL CMOS-BASED BICMOS PROCESS AND METHOD OF FABRICATION

[75] Inventors: Louis N. Hutter, Richardson; John P. Erdeljac, Plano, both of Tex.

[73] Assignee: Texas Instruments Incorporated, Dallas, Tex.

[21] Appl. No.: 592,108

[22] Filed: Oct. 3, 1990

[51] Int. Cl.$^5$ .......................................... H01L 21/335
[52] U.S. Cl. .......................................... 437/41; 437/51; 437/57; 437/34; 437/31
[58] Field of Search ............... 437/56, 57, 51, 34, 437/40, 41, 44, 31, 52; 357/23.3, 23.4, 43

[56] References Cited

U.S. PATENT DOCUMENTS

| | | | |
|---|---|---|---|
| 4,403,395 | 9/1983 | Curran ................................ | 437/59 |
| 4,795,716 | 1/1989 | Yilmaz et al. ...................... | 437/56 |
| 4,855,244 | 8/1989 | Hutter et al. ...................... | 437/31 |
| 4,914,051 | 4/1990 | Huie et al. ........................ | 437/59 |

*Primary Examiner*—T. N. Quach
*Attorney, Agent, or Firm*—B. Peter Barndt; Richard L. Donaldson

[57] ABSTRACT

An integrated circuit is provided wherein bipolar, CMOS and DMOS devices are merged together on one chip with fabrication taking place from a CMOS point of view rather than from a bipolar point of view as in the prior art and p-type epitaxial silicon is used as opposed to n-type epitaxial silicon in the prior art. The integrated circuit uses a P+ substrate upon which a P-epitaxial layer is formed. N+ buried regions isolate the DMOS, PMOS and NPN bipolar devices from the P-epitaxial layer. Each of the devices is formed in a N-well with a first level of polysilicon gate layer providing both the gate and masking for the backgate diffusion of the DMOS device and a sidewall oxide later formed on the first level gate layer to control the diffusion of the source and drain regions of the DMOS device to control channel length. A second level of polysilicon layer provides the gate structures for the CMOS devices as well as one plate of a capacitor. The second level of polysilicon acts as a mask for the source and drain region implants of the CMOS devices. A sidewall oxide later formed on the second polysilicon level further controls the channel lengths of the CMOS structures. A third level of polysilicon provides the second capacitor plate for the capacitor. The DMOS device is isolated from the remaining circuitry by the p-type epitaxial layer and the peripheral portion of the DMOS device is terminated by a PN junction.

34 Claims, 11 Drawing Sheets

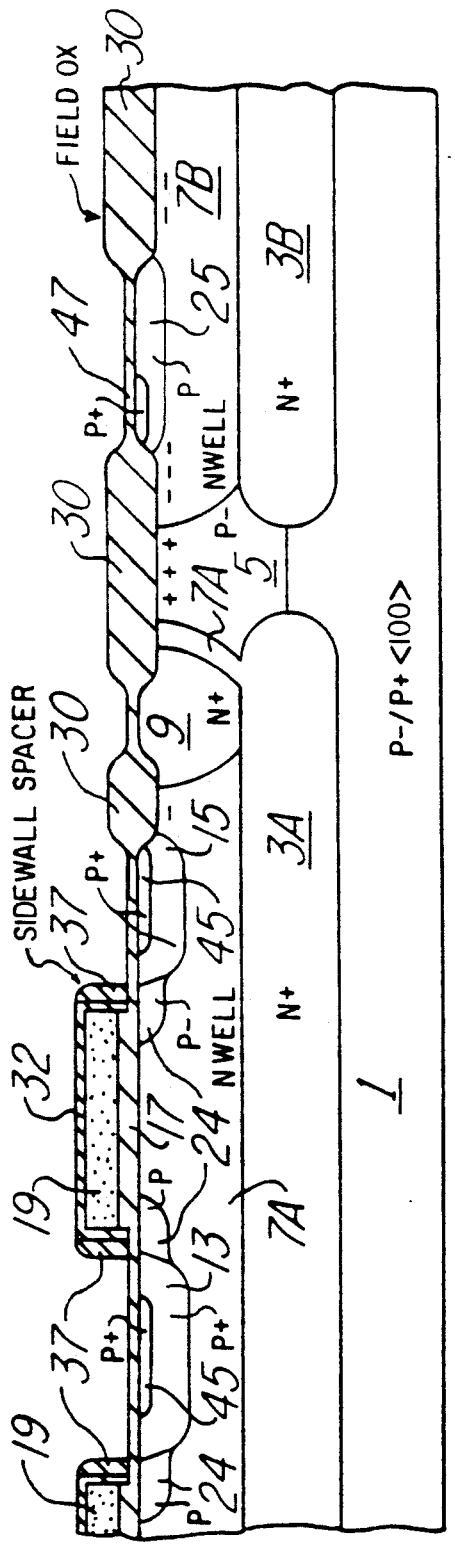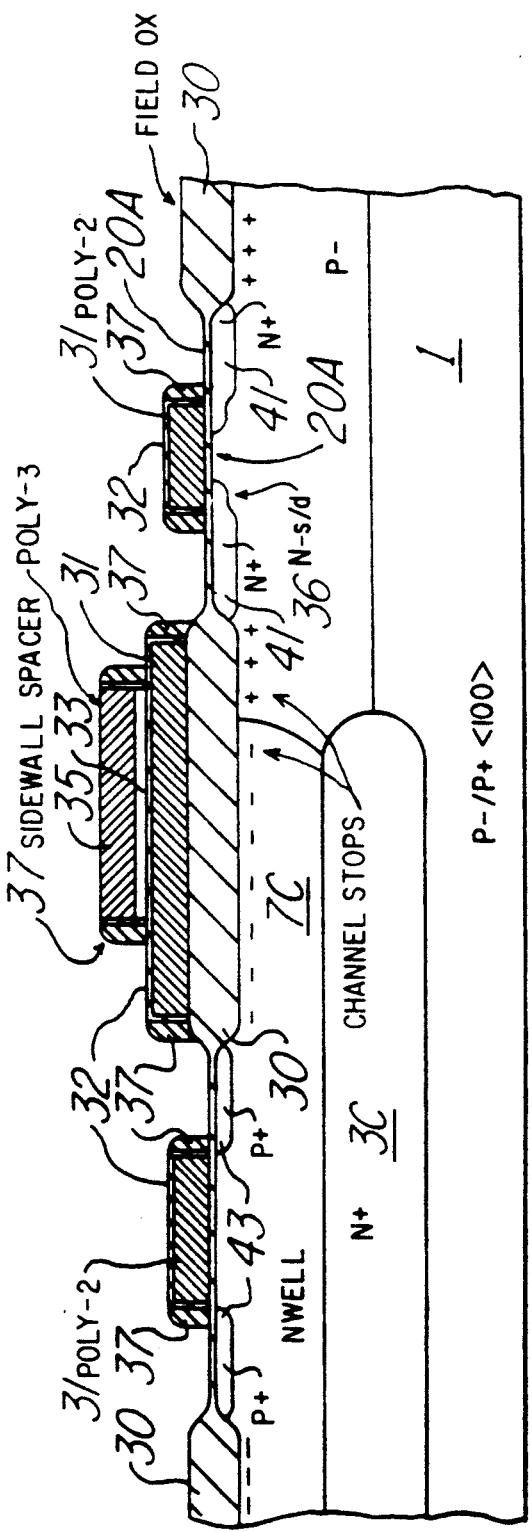

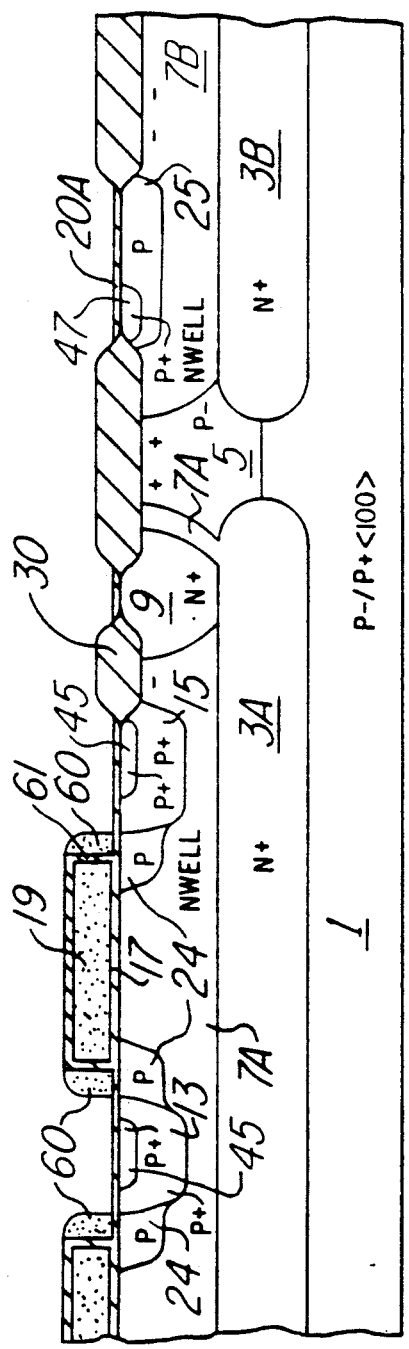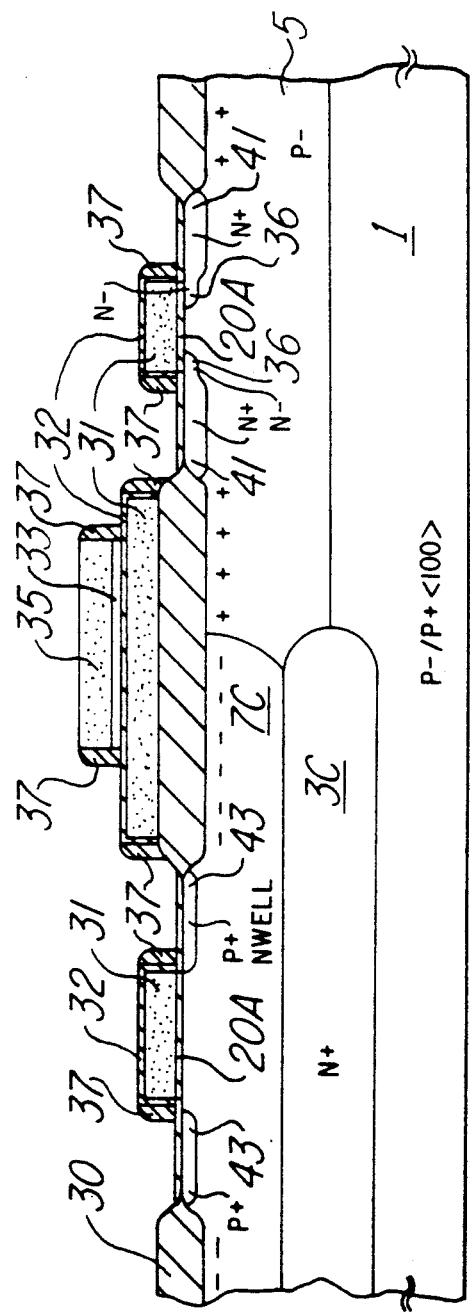

VERTICAL DMOS TRANSISTOR STRUCTURE BUILT IN AN N-WELL CMOS-BASED BICMOS PROCESS AND METHOD OF FABRICATION

BACKGROUND OF THE INVENTION

1. Field of the Invention

This invention relates to integrated circuits and the fabrication of such circuits and, more specifically, to a method of integrating an n-channel vertical double diffused MOS (VDMOS) structure into an N-well CMOS-based bipolar CMOS (BiCMOS) process flow and the device.

2. Brief Description of the Prior Art

For many years, attempts have been made to combine several functions on the same semiconductor chip in order to reduce the number of chips required in a system, improve the overall reliability of the system and reduce the size of the system. Many applications, for example, require a combination of high power, digital logic and analog functions.

A typical device used for power functions has been the vertical DMOS (VDMOS) transistor which is an asymmetric, short-channel, NMOS transistor capable of withstanding high drain-source voltages in the OFF state, but which has very low series resistance in the ON state. While some types of devices can meet these requirements, they either consume excessive power or occupy a large amount of silicon real estate, thereby preventing cost-effective integration. In the past, BiCMOS processes capable of integrating the VDMOS device have been based upon standard bipolar process flows while using a P-well CMOS approach to support the logic functions. However, these bipolar-oriented approaches generally lead to low device packing densities due to the deep P+ isolation diffusions required. Furthermore, the P-well CMOS fabrication procedures are often incompatible with most present standard cell fabrication procedures which are based upon N-well CMOS processes.

At present, BiCMOS processes accommodating VDMOS devices have been based upon conventional bipolar technology. Here, an N+ buried layer is selectively diffused into a p-type substrate, followed by an n-type epitaxial deposition. After standard isolation techniques, the basic bipolar CMOS and VDMOS devices are built as discussed in the U.S. Pat. No. 4,325,180 of Curran. In such a process, a P-well is provided to house the NMOS transistors while the PMOS devices are built in the epitaxial layer.

In order to build the VDMOS structure, a common diffusion mask edge is typically used to self-align both the p-type DMOS well (D-well) and the N+ source regions. Since the D-well is diffused into the n-type epitaxial layer and the N+ source is diffused into the D-well, a short lateral p-type region (i.e., the channel) is formed along the silicon surface between the two n-type regions. Most present BiCMOS processes use polysilicon as the common diffusion edge, resulting in a self-aligned device structure. Typically, the same polysilicon layer is used to form both the CMOS and VDMOS gates.

Several problems arise with the present bipolar-oriented BiCMOS processes as follows:

1) The majority of present advanced BiCMOS processes are driven from an N-well CMOS starting point. In this approach, p-type epitaxial silicon rather than n-type is used. As a result, the VDMOS device as originally conceived will no longer function.

2) The VDMOS channel length is determined by the difference in the DMOS well and source lateral diffusions. Thus, efforts to reduce the D-well junction depth in order to improve the performance of the VDMOS structure in the ON state through reduced VDMOS cell JFET resistance can lead to extremely short channel lengths which cannot withstand the high reverse voltage in the OFF state. This problem is exacerbated by the fact that the lateral diffusion is less than the vertical diffusion and that oxidation-induced phosphorus pile-up at the n-epi (epitaxially deposited) surface can further reduce the D-well lateral diffusion.

3) Since the polysilicon used for the VDMOS gate electrode is the same as that used for the CMOS gates, the heat-cycling associated with the deep D-well diffusion will impact both the channel stop and threshold voltage (Vt) implants, leading to increased MOS scaling problems, such as Vt rolloff, punchthrough and channel width reduction.

4) Present VDMOS device designs use a lateral DMOS (LDMOS) structure to terminate the structure at the edges. This technique uses a tapered field oxide to support the high voltage by spreading the electric field in the oxide as the gate polysilicon steps up onto the field oxide. This need for a soped moat/field oxide transition is opposed to the direction of current LOCOS techniques which attempt to minimize the field oxide "bird's beak".

5) There is a direct coupling of the DMOS voltage capability and the NPN Ft (transition frequency, a figure of merit for speed of the NPN transistor) performance when the NPN base and emitter regions are used as the DMOS backgate and source regions, respectively, as is often done in BiCMOS/VDMOS processes. While a thin vertical base width improves the NPN Ft, it results in a short lateral channel length, which can compromise DMOS BVdss. Recently, shallow arsenic emitters have been used to achieve adequate DMOS BVdss (breakdown voltage from drain to source with back gate short circuited). This, however, leads to slower NPN transistors in the merged BiCMOS process since the base depth cannot be scaled too much or low avalanche DMOS BVdss will occur due to junction curvature effects.

The above noted problems have been minimized to some extent by use of a fabrication process set forth in application Ser. No. 07/120,558 of Hutter et al., filed Nov. 13, 1987, now U.S. Pat. No. 4,994,887 for High Voltage Merged Bipolar/MOS Technology, which is assigned to the assignee of the subject application, wherein CMOS and bipolar transistor have been formed on a single chip using a p-type epitaxial layer, the contents of this application being incorporated herein in its entirety by reference. In that application, the integrated circuit uses a P+ substrate upon which a P− epitaxial layer is formed. N+ regions are formed in the first P− epitaxial layer. The N+ regions provide low resistance regions for the PMOS transistors and the NPN transistors, while the P+ substrate provides a low resistance region for the NMOS transistors. Alternatively, a P+ region can be formed in the first P− epitaxial layer under the NMOS device, but isolated from the N+ regions. This provides low resistance areas for each of the respective devices while accommodating high voltage NPN transistors.

In another aspect of the above noted application, the high temperature bipolar diffusion and oxidation cycles are performed before the CMOS active region definition in order to maintain the characteristics of the NMOS and PMOS devices. This provides the technical advantage of allowing standard CMOS cells to be used in the design of the digital/analog circuits.

In yet another aspect of the above noted application, a nitride layer is formed over the surface of the integrated circuit prior to the diffusion of the base regions in order to act as an oxidation barrier. This provides an inert anneal which minimizes damage due to silicon oxidation during the diffusion. Alternatively, the nitride layer can be formed prior to implantation in order to reduce damage to the silicon during the ion implantation process. It may also be desirable to leave the nitride layer over the base region during other high temperature cycles, such as thermal oxidation. However, the problem of providing DMOS transistors on the same chip in conjunction with the CMOS and bipolar transistors was not solved therein.

SUMMARY OF THE INVENTION

In accordance with the present invention, the above described problems of the prior art are minimized.

Briefly, in accordance with the present invention, an integrated circuit is provided wherein bipolar, CMOS and DMOS devices are merged together on one chip with fabrication taking place from a CMOS point of view rather than from a bipolar point of view as in the prior art and p-type epitaxial silicon is used as opposed to n-type epitaxial silicon in the prior art.

The integrated circuit of the present invention uses a P+ substrate upon which a P− epitaxial layer is formed. NMOS devices are built in the P−epi layer, while DMOS, PMOS and NPN devices are built in N-wells, which are diffused into the epi layer. N+ buried layers are formed under the N-wells to lower the resistance of these regions. A first level of polysilicon is used to form the DMOS gate electrodes as well as to act as a diffusion mask and edge for the D-well backgate diffusion. Subsequently, a sidewall spacer is formed on the lateral edges of the DMOS gate electrodes, which is used to control the lateral extent of the DMOS source diffusion under the DMOS gate electrode, thereby defining the channel length of the device. In one embodiment of the invention, the sidewall spacer is formed using oxide, while in the second embodiment, a polysilicon spacer is used. A second level of polysilicon is used to form the gate electrodes for the CMOS devices on the circuit. An oxide sidewall spacer is formed on the lateral edges of these devices to control their channel lengths. Additional polysilicon layers can be used to provide resistors and capacitors, for example. The DMOS device is electrically isolated from other components on the circuit by means of the p-type epitaxial regions. Furthermore, the peripheral regions of the active DMOS device use a P-N junction to support the high drain-to-backgate electric fields, avoiding the necessity of using tapered field oxides.

BRIEF DESCRIPTION OF THE DRAWINGS

FIGS. 3, 3a, 4, 4a, 5, 5a, 6, 6a, 7, 7a, 8, 8a are cross sectional side views of a device in accordance with the present invention at various stages during the process of fabrication thereof;

FIGS. 9, 9a, 10, 10a, 11, 11a are cross sectional side views of a second embodiment of the invention at various stages during the process fabrication thereof;

DESCRIPTION OF THE PREFERRED EMBODIMENTS

Figure 1:
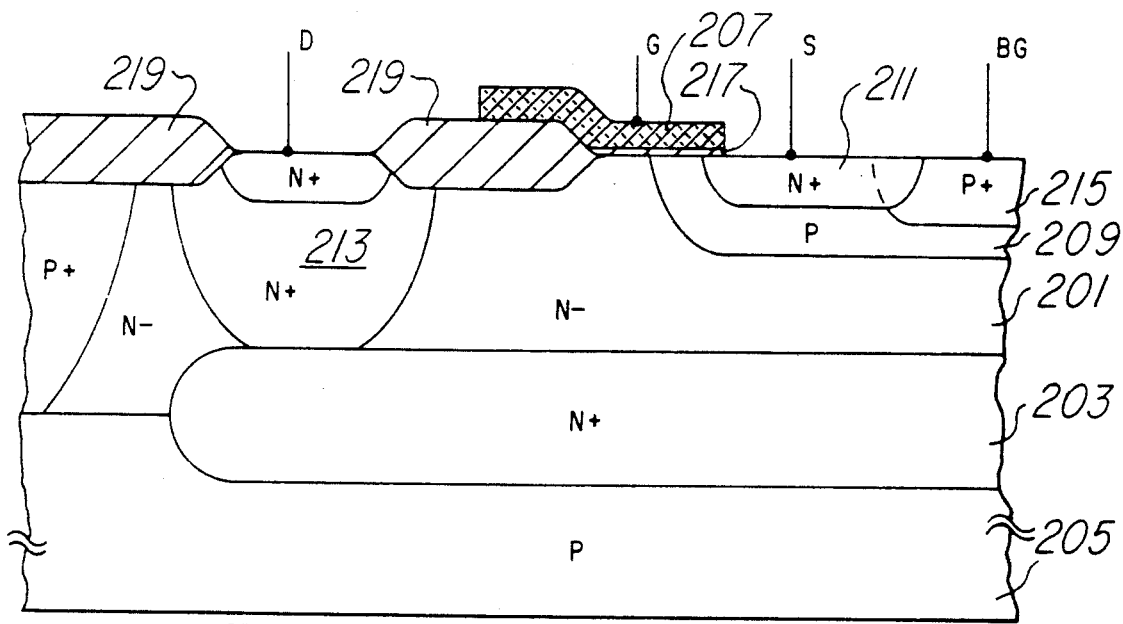
FIG. 1 is a simplified cross sectional view of a prior art DMOS transistor.
Figure 2:
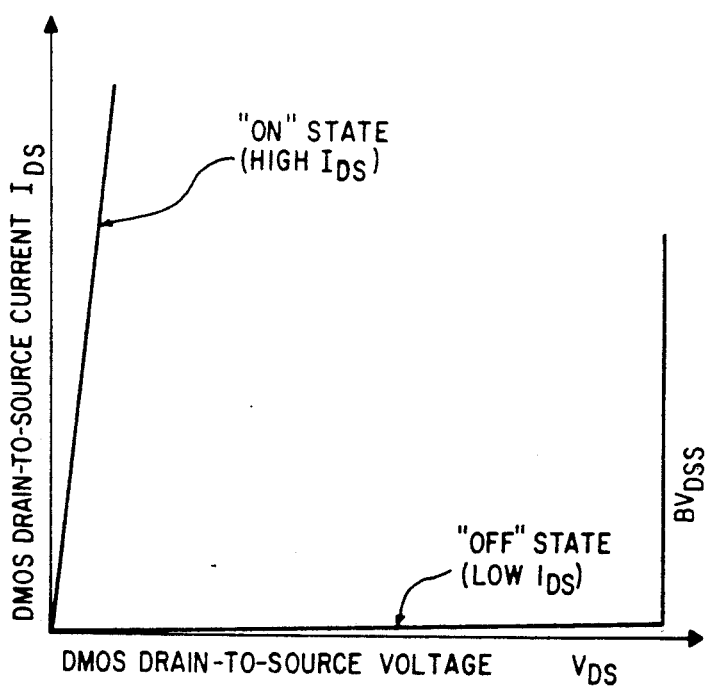
FIG. 2 shows the electrical meanings of the OFF and ON states for the CMOS device.

Referring first to FIG. 1, there is shown a simplified cross sectional view of a prior art vertical DMOS transistor. The transistor is formed in an n− epitaxial layer 201 which lies over an n+ buried layer region 203 which is atop a p-type substrate 205. The polysilicon gate region 207 acts as a mask edge for the initial diffusion of a p-type region or D-well 209 which diffuses downwardly as well as laterally. A subsequent n+ diffusion 211 into the D-well which is also masked by the polysilicon gate region provides an n+ region surrounded on bottom and sides by the p-type D-well 209. This n+ region 211 is the source of the DMOS transistor whereas the portion of the D-well 209 between the source and n− epitaxial region 201 at the silicon surface is the channel. The n− region 201 is a lightly doped drain (LDD) and is contacted through another n+ diffusion 213. A backgate (BG) contact p+ diffusion 215 is used for electrical connection to the D-well remote from the channel and polysilicon gate. The drain 201 is capable of withstanding high reverse biases in the OFF state due to its light doping and the large radius of curvature of the D-well 209, yet provides very low resistance in the ON state due to its very short channel length and the low series resistance provided by the n+ buried layer 203 and the deep N+ contact diffusion 213. Typical gate oxides 217 range from about 500 to 1500 Angstroms, while the field oxide 219 is typically greater than 1 micrometer and has a pronounced slope (as shown) in the transition region as high electric field in this region can limit the maximum OFF-state BVdss. FIG. 2 shows the electrical meanings of the OFF and ON states for the DMOS device.

The preferred embodiment of the present invention is best understood with reference to FIGS. 3 to 8 of the drawings wherein like numerals are for like and corresponding parts of the various drawings. It should be understood that the two portions of FIGS. 3 to 7 represent only one substrate with all N-wells separated from each other by a P− regions wherein the minus (−) indicates a doping level of from about $1 \times 10^{15}$ to $1 \times 10^{16}$ atoms/cc and that all N+ buried layer regions are separated from each other by the same P− region and the P− epitaxial region over the substrate noted as 1 hereinbelow wherein the plus (+) indicates a doping level of about $1 \times 10^{19}$ atoms/cc or greater.

Figure 3:
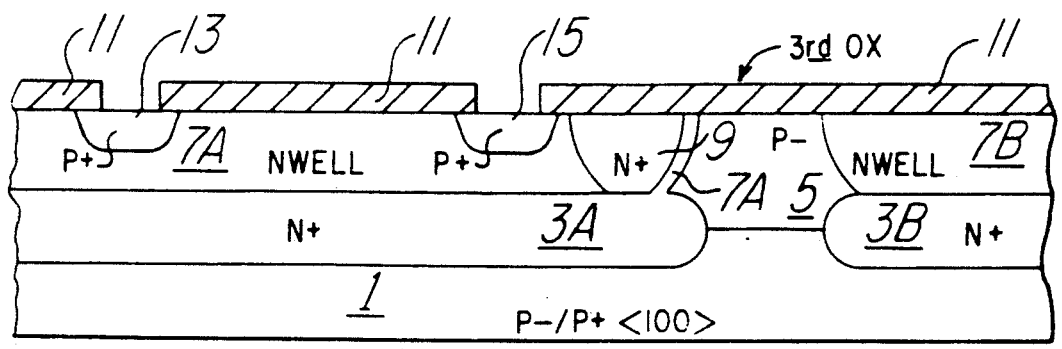
Figure 3A:
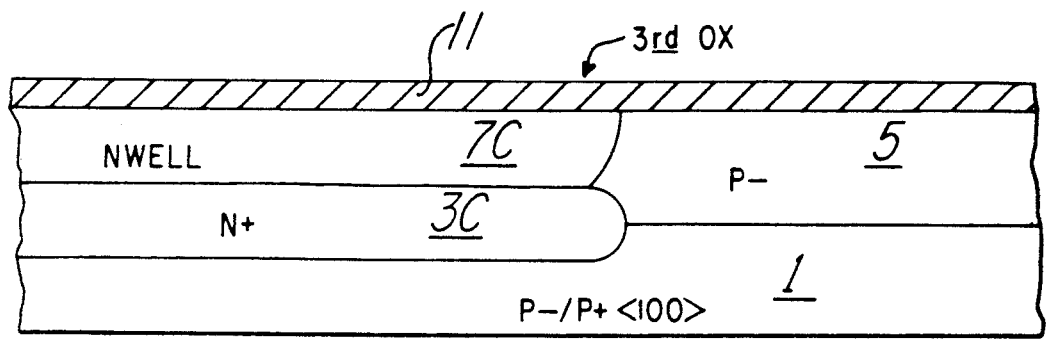

FIG. 3 is a cross sectional side view of a device in accordance with the preferred embodiment after a first plurality of processing steps have taken place. To provide the structure of FIG. 3, initially, there is provided a P+ silicon substrate having a P-type epitaxial silicon layer thereover. The combination of substrate and epitaxial layer thereover are denoted as 1 and shown as elements 48 and 46 respectively in the above noted copending application. An oxide layer is then grown on on the surface of the P− layer 1 in standard manner, such as by thermal oxidation. The oxide layer is then patterned in standard manner with a photoresist and etched, the photoresist is removed and an N-type impurity, such as antimony, is implanted into the exposed portion of the P−epitaxial layer 1 and subsequently diffused to form N+ buried layer regions 3A, 3B and 3C. The remaining oxide layer is then removed in standard manner and a P− epitaxial silicon layer 5 with a thickness in the range of 8.0 to 9.0 microns is deposited in standard manner over the buried layers 3A, 3B and 3C and the exposed portion of layer 1. A second oxide layer is then formed over the P− layer 5 and patterned and phosphorus is implanted into the exposed portions of the layer 5 and diffused to form three spaced apart N-well regions 7A, 7B and 7C having a surface doping concentration of about $1 \times 10^{16}$ and extending down to contact the buried layer 3A, 3B and 3C. Each of the regions 7A, 7B and 7C will contain one of the vertical DMOS, CMOS or NPN bipolar transistor. The second oxide layer is then selectively removed using conventional photoresist processing techniques and an N-type impurity, preferably phosphorus, is deposited and diffused through the N-well 7A, extending to the buried layer region 3A to form an N+ contact 9 thereto and provide a low series resistance path from the device surface to the buried layer 3. After the second oxide is removed, a third oxide layer 11 is formed on the device surface, patterned and etched and a P-type impurity, preferably boron, is deposited and diffused into spaced apart portions of the N-well region 7A in which the vertical DMOS device is being formed to provide spaced P+ regions 13 and 15 at the surface of that N-well 7A. The result after the above described steps is shown in FIG. 3. The use of p+ regions 13 and 15 is optional, as they impact only the ruggedness of the DMOS device to high-voltage transient signals.

Figure 4:
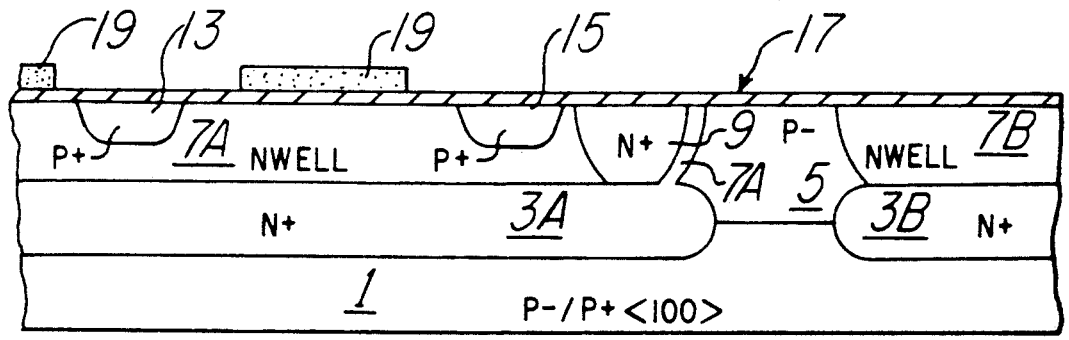
Figure 4A:
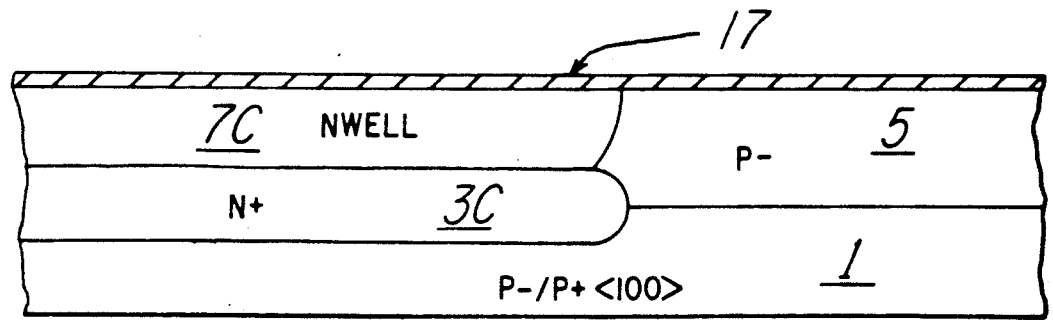

The third oxide layer 11 is then removed in standard manner and a DMOS gate oxide 17 of about 500 Angstroms is grown over the surface of the entire device. Then the first polysilicon layer, which provides DMOS gate regions 19 and provides a mask for subsequent double diffusion of the source and backgate of the DMOS device is deposited over the gate oxide 17 by standard techniques. The polysilicon can be doped with an N-type dopant, preferably phosphorus, patterned with photoresist and etched, removing all of the polysilicon except the portion 19 forming the DMOS gate electrode. The result after the above described steps is shown in FIG. 4.

Figure 5:
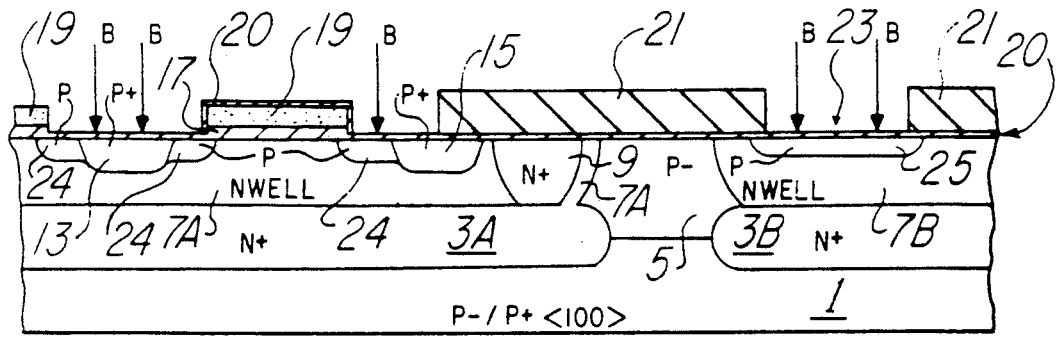
Figure 5A:
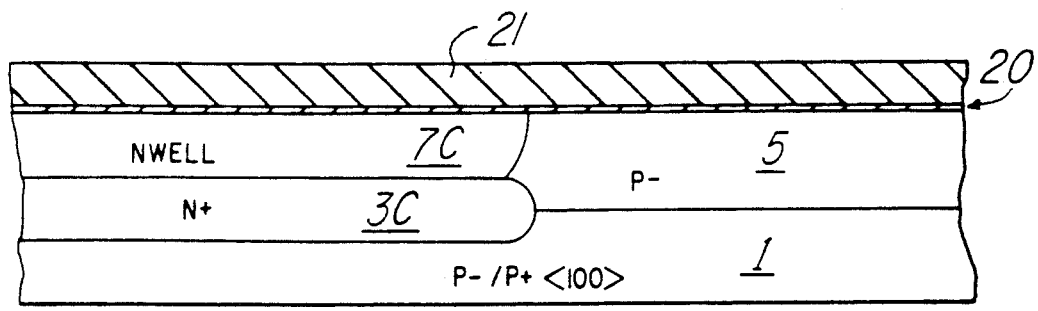

The exposed portion of the gate oxide layer 17 is then removed in standard manner and a thin (100 to 600 Angstrom) pad oxide layer 20 is thermally grown. A photoresist layer 21 is then formed over the entire device and patterned to expose the DMOS structure, including P+ regions 13 and 15 and gate electrode 19, as well as a region 23 over one of the N-well regions whereat the bipolar NPN transistor will be formed. A P-type impurity, preferably boron, is then implanted into the exposed regions to form the DMOS backgate regions 24. The same P-type impurity is also implanted into region 23 to form a P-type region 25 which will ultimately be the base of the NPN transistor. The result after the above described steps is shown in FIG. 5.

Figure 6:
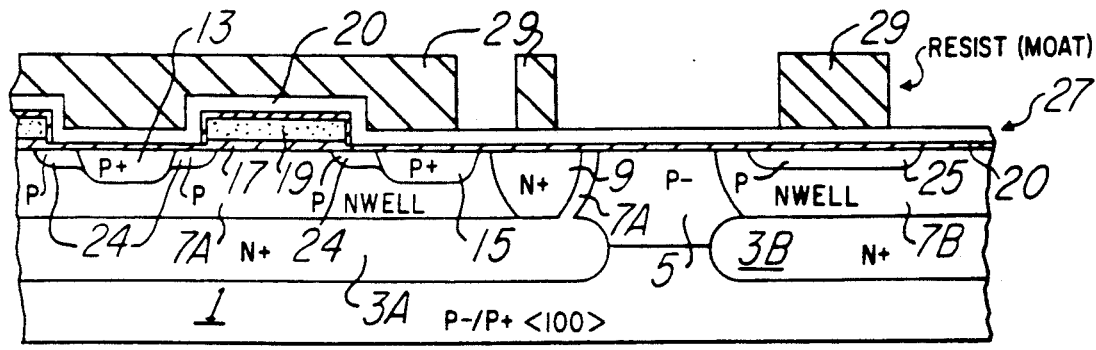
Figure 6A:
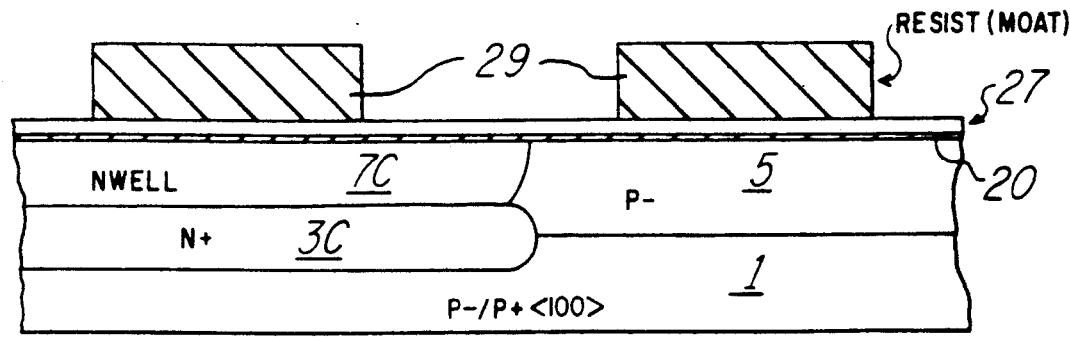

The photoresist 21 is then removed, a silicon nitride layer 27 is deposited over the entire surface of the device by low pressure chemical vapor deposition (LPCVD) and the base diffusion is performed. This diffusion causes the D-well regions 24 to extend laterally under the DMOS polysilicon gate electrode 19, with the p-type surface concentration decreasing with increasing distance under the polysilicon gate. In addition, this diffusion process sets the junction depth of the NPN base region, which is about 2.0 microns. A photoresist layer 29 is then deposited over the silicon nitride layer 27 and patterned to expose some of the silicon nitride layer in preparation for the local oxidation of silicon (LOCOS) process. The result after the above described steps is shown in FIG. 6.

The exposed nitride 27 is removed, optional channel stop implants are performed, and thick (5K to 15K Angstrom) field oxide 30 is thermally grown. The remaining nitride 27 is removed using conventional techniques, the underlying pad oxide layer 20 is removed and a new gate oxide 20A is thermally grown. This gate oxide will be used for the CMOS devices. The gate oxide 20A thickness is typically in the range of 100 to 500 Angstroms. An optional boron implant (not shown) can be provided to set the CMOS threshold voltages. The second polysilicon layer denoted as 31 which forms the gates of the CMOS devices and one plate of the capacitor is then thermally deposited, doped n-type, preferably with phosphorus, patterned and etched using conventional processes. In the preferred embodiment of the invention, the etch process for this second level polysilicon is such that no residues, sometimes referred to as filaments, are left of the lateral edges of DMOS gate electrodes 19. Such etch processes are routinely available in the industry. An interlevel oxide 32 is then thermally grown over the exposed polysilicon-2 layer 31 and a thin (250 Angstrom) nitride film 33 is deposited over the entire wafer to complete the capacitor formation process. Next, a polysilicon-3 layer 35 is deposited over the nitride layer 33. Phosphorus is then implanted into layer 35 and annealed. A photoresist pattern is defined and the exposed polysilicon-3 material and the underlying nitride layer 33 are etched using conventional techniques. Again, polysilicon filaments are avoided through added overetching. The layer 35 is a second capacitor plate and provides a capacitor in conjunction with the capacitor plate portion of polysilicon-2 layer 31. After a photoresist pattern is defined on the wafer, a phosphorus inplant dose in the range of $1 \times 10^{13}$ to $1 \times 10^{14}$ atoms/cc is performed, thereby forming conventional LDD N− regions 36 in the NMOS source/drain areas. Following the removal of the photoresist oxide, sidewall spacers 37 are formed on the vertical sidewalls of the polysilicon layers 19, 31 and 35 by a conformal oxide deposition and an anisotropic etch as is known in the art.

The device is again patterned with photoresist and arsenic or phosphorus is implanted with a dose in the range of $1 \times 10^{15}$ to $1 \times 10^{16}$ atoms/cc to form the N+ source/drain regions 41 of the NMOS portion of the CMOS device. The photoresist is then removed and the device is again masked and patterned and boron is implanted with a dose in the range of $1 \times 10^{15}$ to $1 \times 10^{16}$ atoms/cc to form the P+ source/drain regions 43 of the PMOS portion of the CMO device as well as a second P+ region 45 in each of the first P+ regions 13 and 15 of the DMOS device to make better backgate contact and into base region 25 of the bipolar device of the NPN transistor to form a better base contact region 47. The photoresist is then removed. FIG. 7 sets forth a side cross section of the device after the above described processing steps have been completed.

Figure 8:
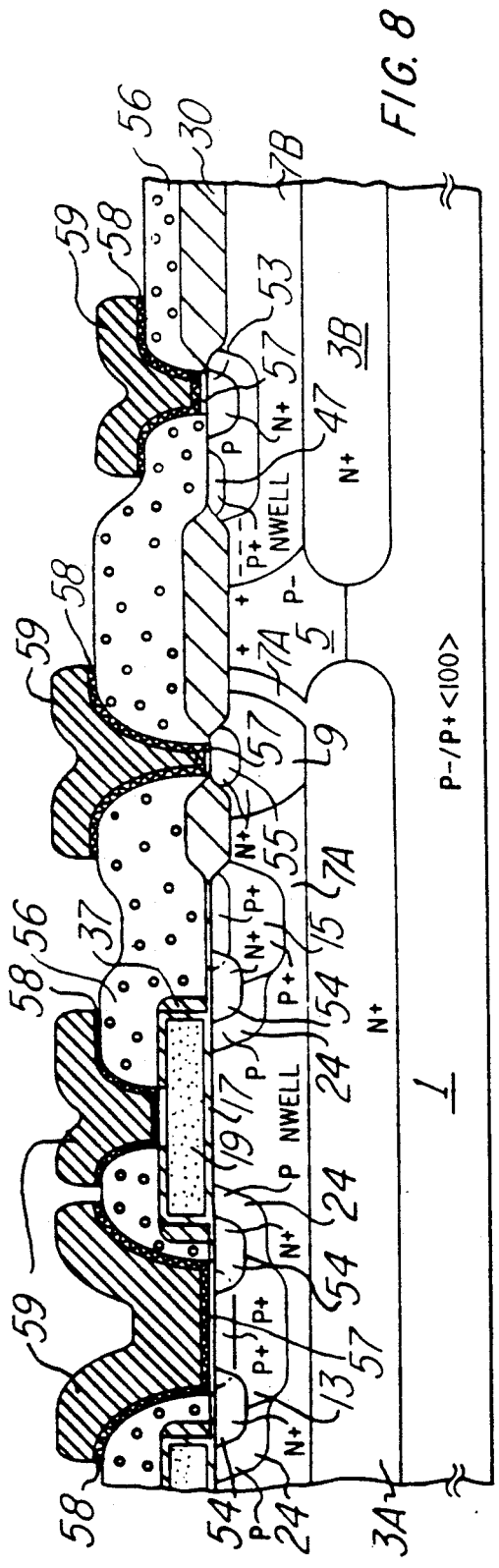
Figure 8A:
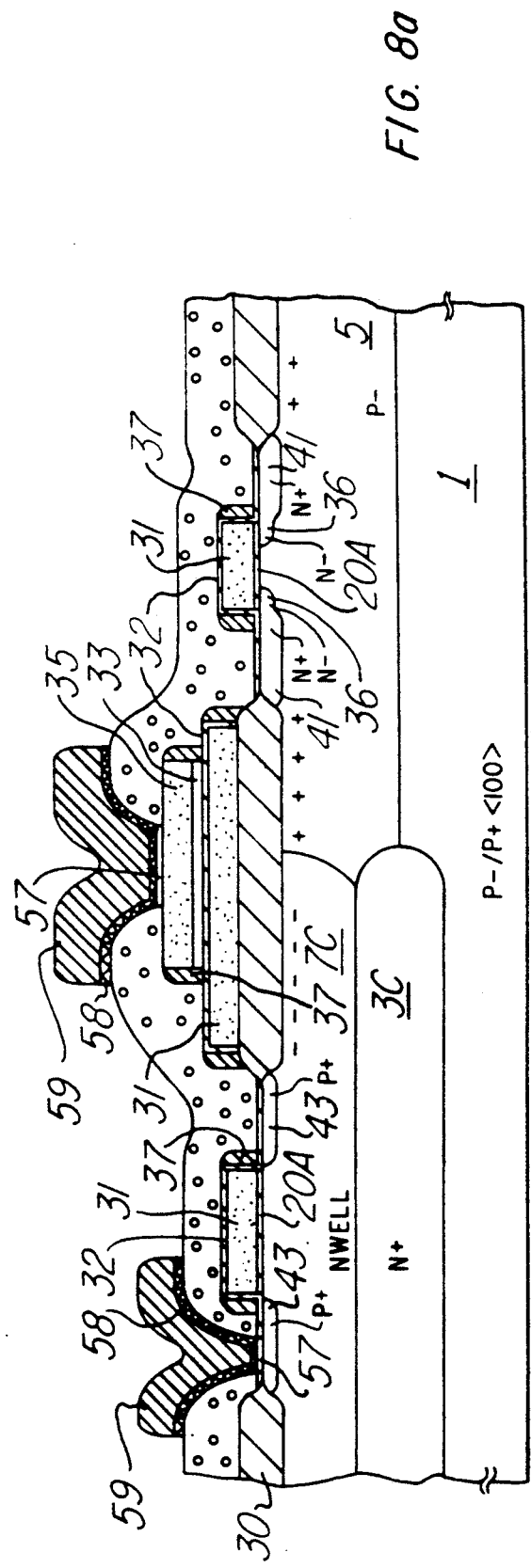

The device is again patterned with a photoresist to expose the DMOS source regions, the DMOS drain regions and the NPN emitter areas. The exposed regions are then implanted with phosphorus having a dose in the range of $1 \times 10^{15}$ to $1 \times 10^{16}$ atoms/cc to form the emitter 53 of the NPN transistor, the DMOS source regions 54 and the DMOS drain contact region 55 A thick (5000 to 10,000 Angstroms) layer of phosphorus-doped oxide 56 is deposited and thermally densified. Contact openings are defined using standard lithographic and etching techniques and an anneal operation is performed to slightly melt the doped oxide layer 56, causing it to reflow and smooth the vertical contact profiles so as to improve metal step coverage. Platinum silicide 57 is formed in the exposed contact regions through conventional techniques, whereupon films of TiW 58 and Al-Si-Cu 59, having thicknesses in the range of 2000 Angstroms and 10,000 Angstroms respectively, are deposited, patterned and etched to form the circuit interconnections. Finally, a protective overcoat layer (not shown), preferably silicon oxide or silicon nitride, is deposited, patterned and etched to expose the metal bond pads, thereby completing the process flow. The junction depth of the emitter diffusion is approximately 1.0 micrometers. FIG. 8 sets forth a side cross section of the device after the above described processing steps have been completed.

It is important to note that, in conventional DMOS processes, the polysilicon gate edge is used to define both the edge of the source and backgate diffusion openings. In the present process, however, the polysilicon gate electrode 19 is used to define the edge of the backgate diffusion opening, while the edge of the sidewall oxide 37 thereon is used to define the edge of the source opening. The thickness of the sidewall material permits a widening of the effective DMOS channel length to minimize short-channel punch-through problems without changing the vertical depth of either the DMOS source or backgate regions. It follows that the sidewall spacer thickness determines the channel length at least in part. This provides an additional measure of control over the channel length. In addition, as the thickness of the sidewall spacer increases, the threshold voltage of the device will increase because the DMOS source region will not extend as far under the gate electrode 19. Thus, it follows that the threshold voltage of the device is controlled at least in part by the thickness of the sidewall spacer.

Figure 9:
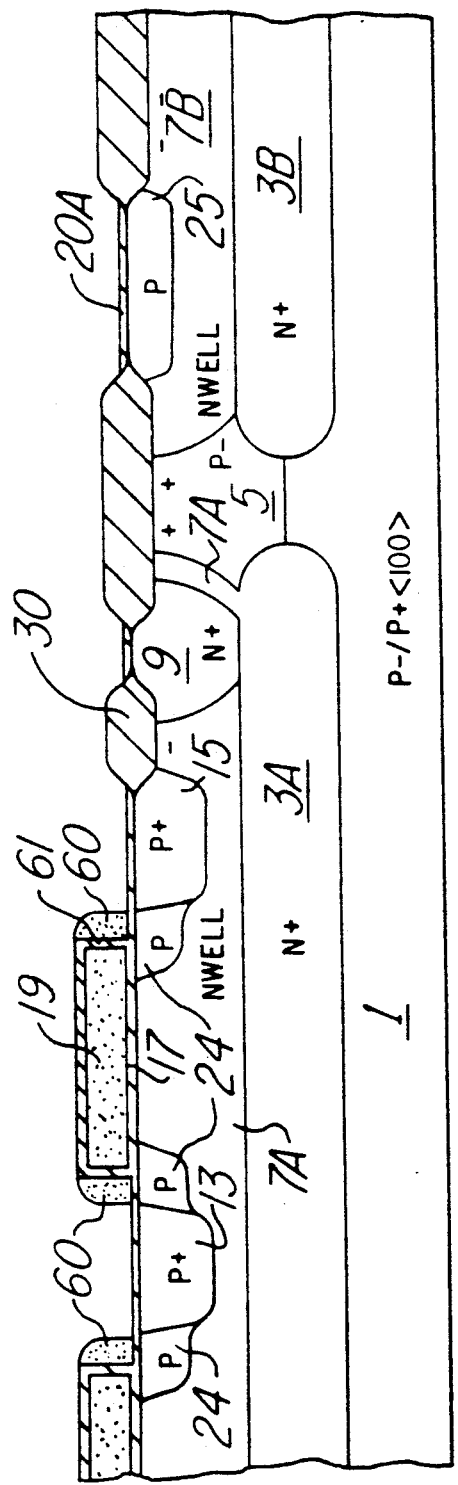
Figure 9A:
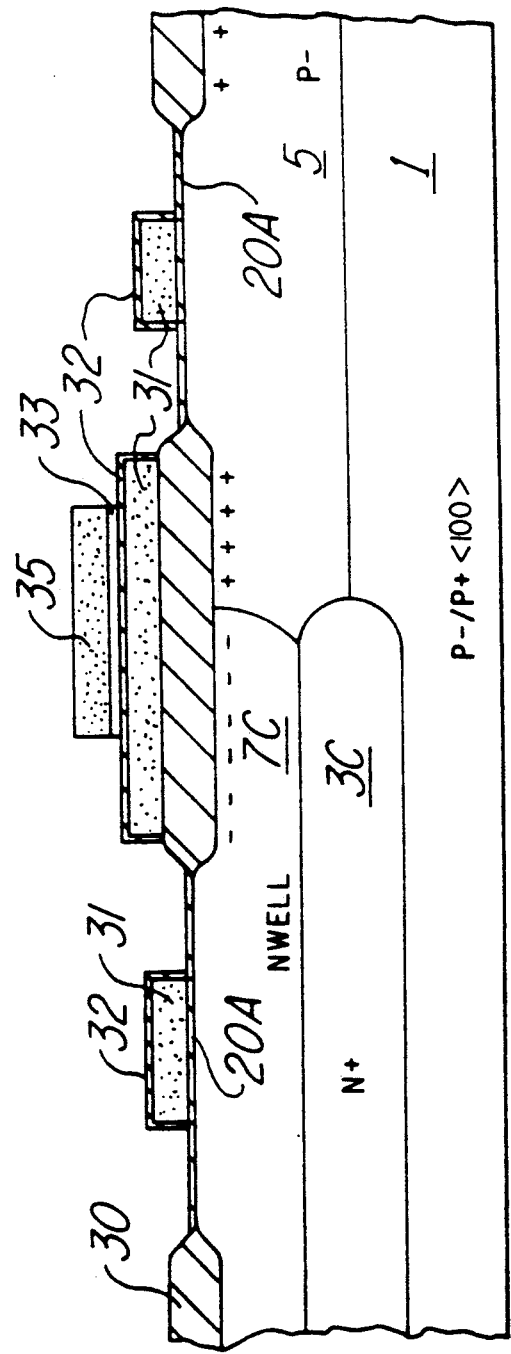

In a second embodiment of he invention, the oxide spacer 37 on the edge of the DMOS gate electrode 19 can be replaced with a polysilicon-2 sidewall spacer which is formed simultaneously with the formation of the CMOS gate electrodes and capacitor bottom plates. FIG. 9 shows a cross-sectional view of the same device components after the polysilicon-2 layer has been deposited, doped, patterned with photoresist, plasma etched and the resist removed. In this embodiment of the invention, the polysilicon etch is again performed using an anisotropic etch process but the amount of overetch is reduced so that the filaments, or sidewall spacers, are not removed from the edges of the DMOS gate electrode. As can be seen, polysilicon spacers 60 are left simultaneously with the formation of the various polysilicon-2 regions 31 for the CMOS gate electrodes and capacitor bottom plate. A thin oxide layer 61 separates the polysilicon-2 sidewall spacer 60 from the polysilicon-1 DMOS gate electrode 19, this oxide having been grown over the polysilicon-1 during the gate oxidation for the CMOS devices.

FIG. 10 shows a cross-sectional view of the device components in the second embodiment of the invention at a point immediately after the boron implant to form the PMOS source/drain regions, etc., at a comparable stage of processing as that shown in FIG. 7 for the first embodiment. It can be seen that only the oxide sidewall spacers 37 are formed on the edges of polysilicon-2 regions 31 and polysilicon-3 regions 35 while only polysilicon-2 sidewall spacers 60 are formed on the edges of polysilicon-1 regions 19 except for the thin oxide 61 which laterally separates regions 60 and 19. It should be noted that the presence of the polysilicon-2 sidewall spacer 60 on the lateral edge of the DMOS gate electrode 19, with its rounded profile, precludes the subsequent formation of an oxide sidewall spacer thereon. The method of forming a sidewall spacer to prevent the formation of another spacer at a later time is well known in the industry.

Figure 11:
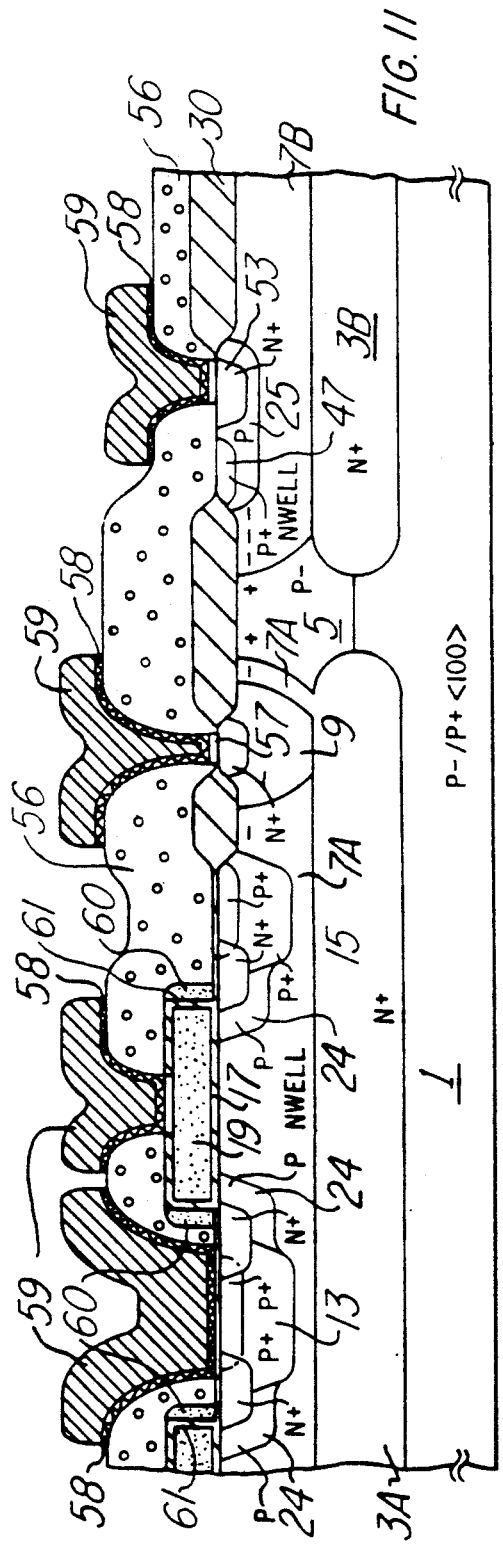
Figure 11A:
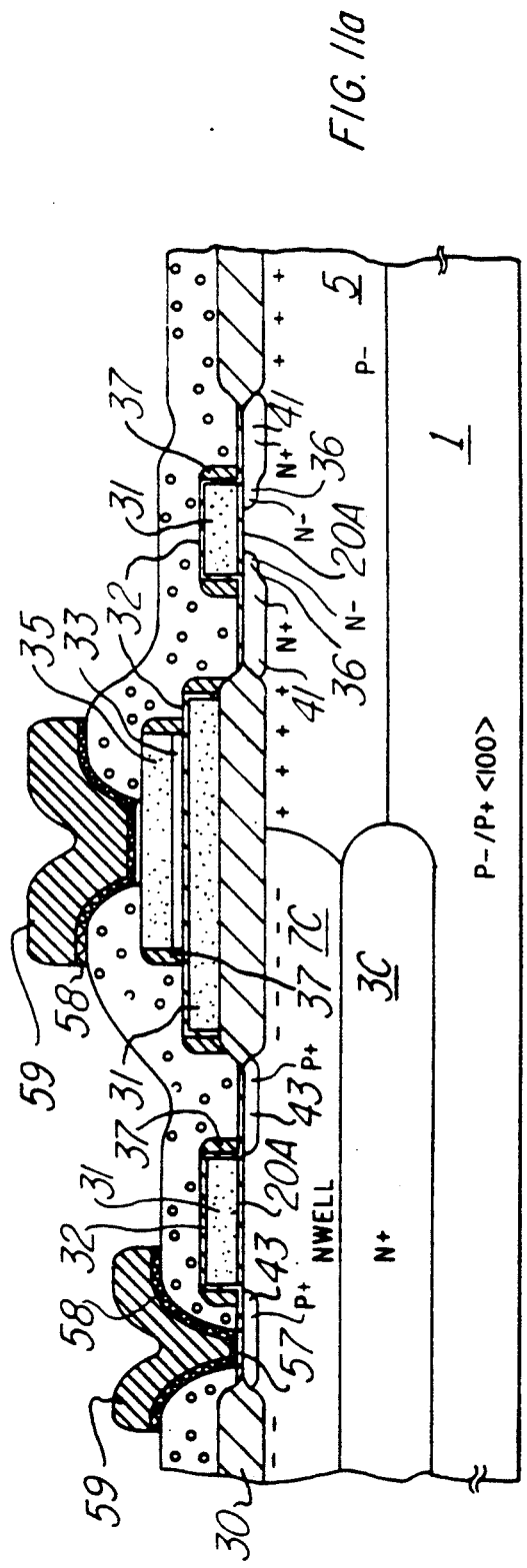

FIG. 11 shows a cross-sectional view of the device components in the second embodiment after all processing has been completed. Here it can be seen that the polysilicon-2 sidewall spacer 60 serves essentially the same purpose as did the oxide sidewall spacer 37 in the first embodiment, namely to serve as an implant masking material so as to shift the edge which defines the DMOS source region diffusion opening. However, since a typical polysilicon thickness is about 5000 Angstroms, while typical sidewall spacer thicknesses range between 2000 and 3000 Angstroms, the polysilicon-2 sidewall spacer can provide a larger increase to both the DMOS channel length and the DMOS threshold voltage.

Figure 12:
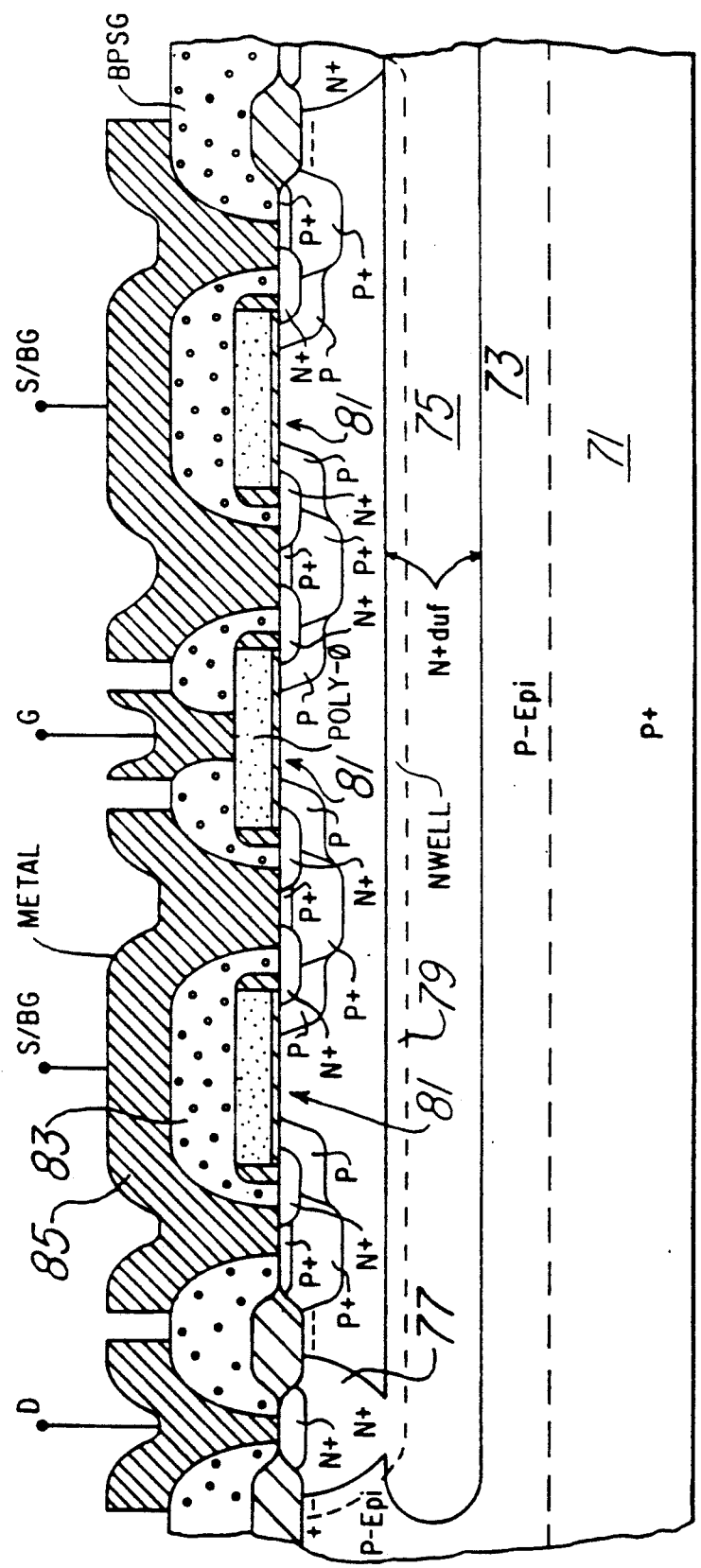
FIG. 12 is a cross sectional side view of a third embodiment in accordance with the present invention.

FIG. 12 is a side cross sectional view of a third embodiment of the invention which is a cellular device capable of high power on the order of 2 to 10 amperes and capable of handling up to about 60 volts in the OFF state. This embodiment is patterned after the device of the above noted copending application. In this embodiment, there is provided a P+ substrate 71 having a P− epitaxial layer 73 thereover and N+ buried layer region 75 formed in the epitaxial layer 73. An N-well 79, which operates as a drain, is diffused to meet the N+ buried layer region 75 to form an N region, the N-well having a surface concentration on the order of about $1 \times 10^{16}$ atoms/cc. A deep N+ contact diffusion to the N+ buried layer region 75 is provided as in the first embodiment. Also shown are several DMOS device 81 as in the first embodiment with borophosphosilicate glass 83 thereover and contacts and metallization 85 over the glass. The end of the DMOS array is terminated by a PN junction formed by the P+ region and the N-well. In the event that the P+ region is not used (it is an optional step), the end of the DMOS array would be terminated by the D-well to N-well PN junction. This permits the use of an untapered field oxide as opposed to running the polysilicon gate electrode up onto the field oxide according to the prior art. It should be apparent that by adjusting the sidewall oxide widths on the polysilicon electrode, the channel length of the DMOS device can be adjusted, thereby providing a multitude of desired properties, such as a higher threshold voltages for lower subthreshold conduction and more resistance to punch-through problems, both of which are very important for extremely large power devices.

Figure 13:
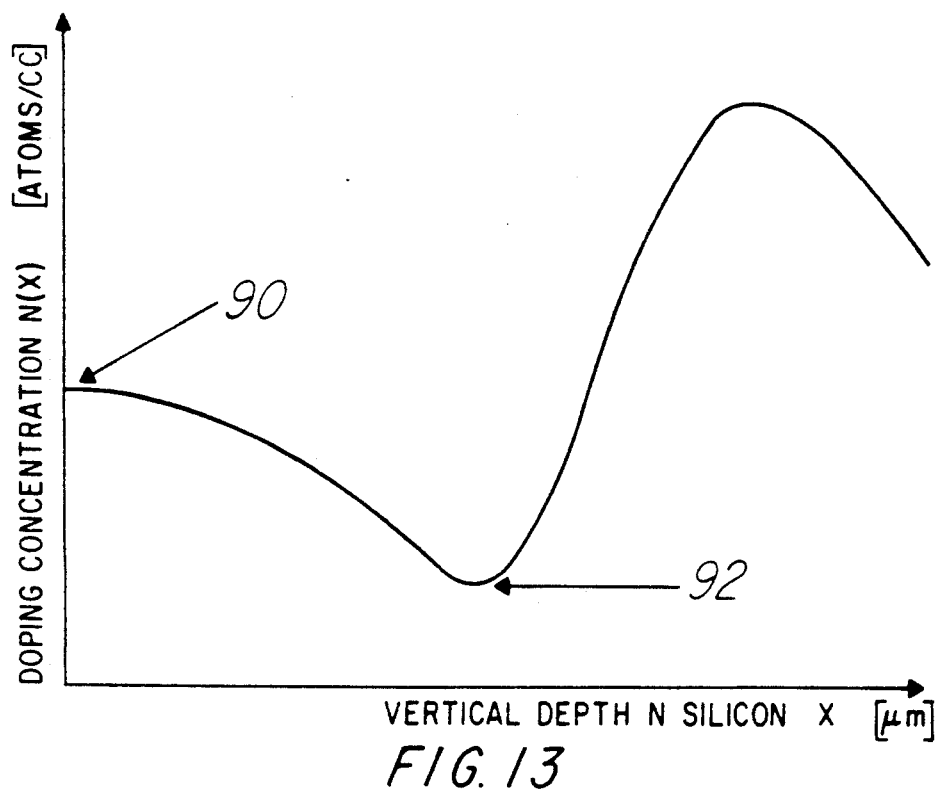
FIG. 13 shows the vertical doping profile for a DMOS drain region using the techniques of the first embodiment of the invention.

It will be appreciated that the current flow in the drain region of the DMOS device is composed of regions where the current flows horizontally in the N+ buried layer region as well as regions where it flows vertically in the lightly doped N-well region. While the lateral resistance of the N+ buried layer is quite small, the vertical resistance of the N-well region can be significant. In fact, it can be shown that for higher voltage DMOS devices, the vertical drain resistance can be a substantial component of the overall ON resistance of the DMOS device. For high-current DMOS devices, this resistance must be minimized to reduce the voltage drop across the device. As was discussed hereinabove, the N-well dopant is implanted into the surface of the silicon and is diffused downward to meet the up-diffusing N+ buried layer region directly therebelow. As a result of the diffusion process, the doping concentration of the N-well is highest at the surface and decreases with increasing depth into the silicon until the N+ buried layer is reached. FIG. 13 shows the vertical doping profile for a DMOS drain region using the techniques set forth in the first embodiment. As can be seen, the N-well doping is highest at point 90 with a typical value in the range of about $1 \times 10^{16}$ atoms/cc while it is lowest at point 92 where it can have a value as small as $5 \times 10^{14}$ atoms/cc. Hence, the N-well contribution to the ON resistance will be greatest in the vicinity of point 92 where the doping concentration is lowest. To lower the ON resistance, it is necessary to increase the doping at point 92, but this would cause the doping at point 90 to be increased also and would lead to reduced surface-related breakdown voltages.

Figure 14:
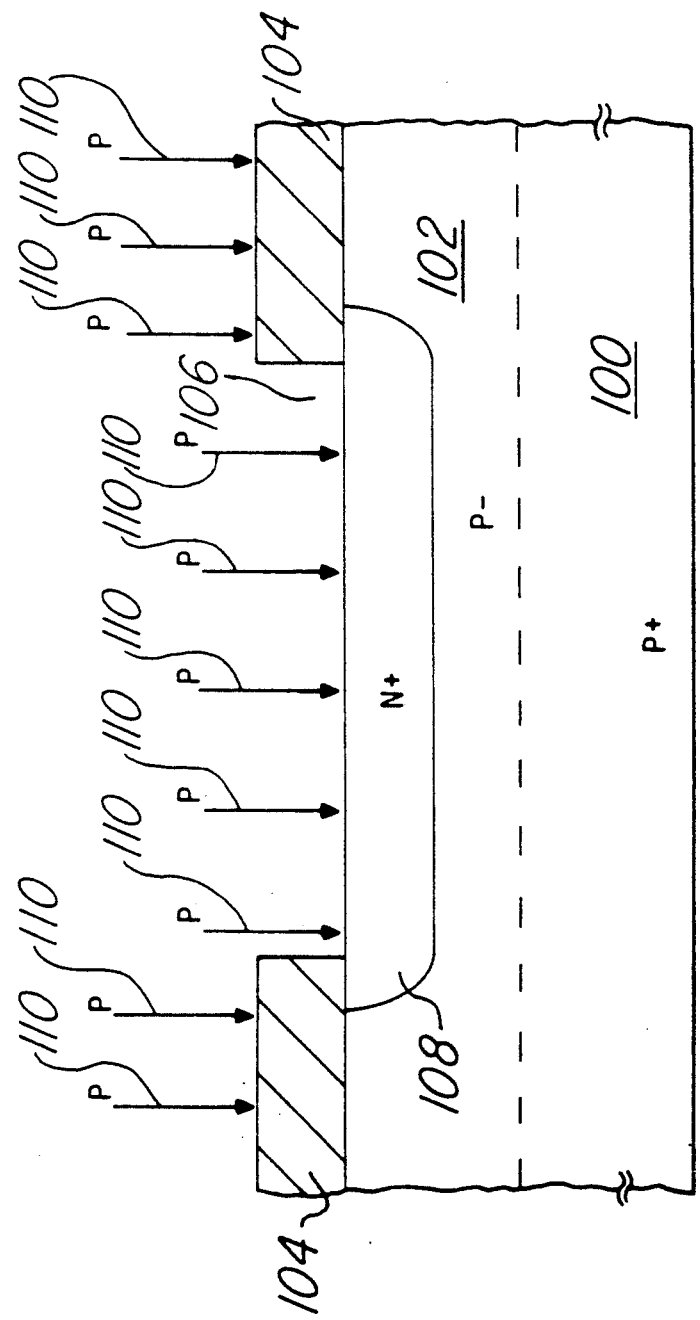
FIG. 14 is a cross sectional side view in accordance with a fourth embodiment of the present invention.

FIG. 14 shows a cross-sectional view of a CMOS device corresponding to a fourth embodiment of the invention. Here, the prior processing has involved the deposition of a P-type epitaxial layer 102 onto a p+ silicon substrate 100, the growth of a masking oxide 104, the patterning and etching of an opening 106, the implant and drive-in of a slow-diffusing species to form a N+ buried layer 108, all process steps being performed in accordance with what has been discussed hereinabove. In this embodiment, however, the thin oxide which is grown over the N+ buried layer region is removed, using conventional deglazing methods, to again expose the silicon surface in the original opening 106. At this point, a fast-diffusing N-type species 110, preferably phosphorus, is implanted into the silicon with a dose in the range of $1 \times 10^{13}$ atoms/cc. The remaining masking oxide 104 is then removed and the process flow described in the first embodiment is resumed, beginning with the second P-type epitaxial deposition.

Figure 15:
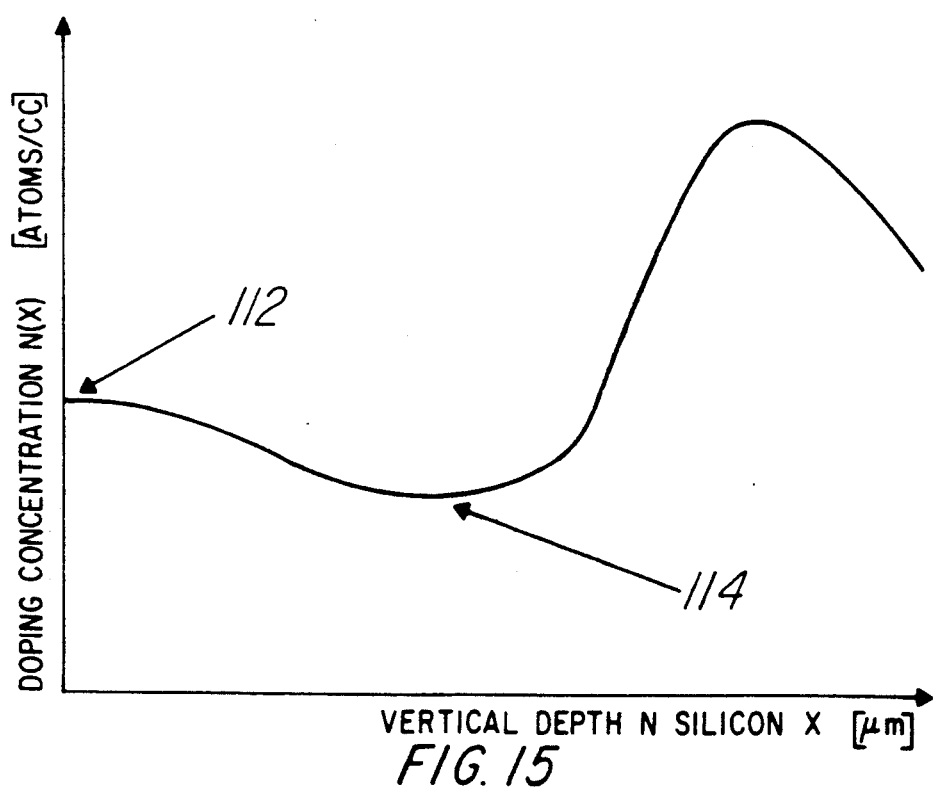
FIG. 15 is a typical vertical doping profile of the DMOS drain region using the techniques of the fourth embodiment of the invention.

Through the introduction of the fast-diffusing species, the resulting N-buried layer will up-diffuse more quickly than the N+ buried layer and will add to the net doping level of the DMOS drain region just above the up-diffusion tail of the N+ buried layer. A typical vertical doping profile of the DMOS drain region using the techniques set forth in this embodiment of the invention is shown in FIG. 15. As can be seen, the surface concentration, denoted by 112, remains unchanged from its value of about $1 \times 10^{16}$ atoms/cc, whereas the lowest doping level, denoted by 1114, has been increased substantially to a value in the range of about $5 \times 10^{15}$ atoms/cc, thereby reducing the ON resistance of the device without perturbing any of the surface-related attributes of the device.

While the previous illustrations describe a DMOS device using the bipolar NPN emitter to form the DMOS source region, it can be appreciated that the CMOS N+ source/drain diffusion could also be used to form the DMOS source region. Since the N+ source/drain diffusion is generally shallower than that of the emitter, a DMOS device with different operating characteristics, such as threshold voltage, could be built. Furthermore, both the NPN emitter implant and the N+ source/drain implant could be used together to form the DMOS source region with yet another set of device characteristics due to the modified diffusion characteristics of phosphorus in the presence of arsenic.

Though the invention has been described with respect to a specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of forming an integrated circuit comprising PMOS, NMOS, DMOS and bipolar transistors, comprising the steps of:
   (a) providing a first P-type layer;
   (b) forming spaced apart N+ regions at a surface of said first P-type layer, each said N+ region corresponding with one of said PMOS, DMOS and bipolar transistor;
   (c) forming a second P-type layer overlying said first P-type layer and said N+ regions, said second P-type layer containing an NMOS transistor; and
   (d) forming spaced apart N-well regions, one said N-well region containing said PMOS transistor, one said N-well region acting as a collector region for said bipolar transistor and one said region containing said DMOS transistor.

2. A method of forming an integrated circuit as set forth in claim 1, further including providing a P+ type substrate adjacent said first P-type layer and remote from said N+ regions at the surface of said P-type layer.

3. A method of forming an integrated circuit as set forth in claim 2 further including providing in said region containing said DMOS transistor a pair of spaced apart regions doped with a P-type impurity and a gate electrode extending over each of said regions having a P-type impurity, said gate electrode further including a sidewall oxide thereon.

4. A method of forming an integrated circuit as set forth in claim 3 further including forming a region doped with an N-type impurity extending under said sidewall oxide in each of said spaced apart regions doped with a P-type impurity.

5. A method of forming an integrated circuit as set forth in claim 4 wherein one of said spaced apart regions doped with a P-type impurity extends sufficiently into said N-well region associated therewith to form an isolating PN junction to isolate said DMOS transistor from the adjacent transistor.

6. A method of forming an integrated circuit as set forth in claim 3 wherein one of said spaced apart regions doped with a P-type impurity extends sufficiently into said N-well region associated therewith to form an isolating PN junction to isolate said DMOS transistor from the adjacent transistor.

7. A method of forming an integrated circuit as set forth in claim 1 further including providing in said region containing said DMOS transistor a pair of spaced apart regions doped with a P-type impurity and a gate electrode extending over each of said regions having a P-type impurity, said gate electrode further including a sidewall oxide thereon.

8. A method of forming an integrated circuit as set forth in claim 7 further including forming a region doped with an N-type impurity extending under said sidewall oxide in each of said spaced apart regions doped with a P-type impurity.

9. A method of forming an integrated circuit as set forth in claim 7 wherein one of said spaced apart regions doped with a P-type impurity extends sufficiently into said N-well region associated therewith to form an isolating PN junction to isolate said DMOS transistor from the adjacent transistor.

10. A method of forming an integrated circuit as set forth in claim 8 wherein one of said spaced apart regions doped with a P-type impurity extends sufficiently into said N-well region associated therewith to form an isolating PN junction to isolate said DMOS transistor from the adjacent transistor.

11. A method of making a DMOS transistor, comprising the steps of:
(a) providing a first P-type layer;
(b) forming an N+ region at a surface of said first P-type layer;
(c) forming an N-well overlying said first P-type layer and said N+ region;
(d) forming said DMOS transistor in said N-well comprising the steps of:
(e) forming a gate insulatingly spaced from said N-well;
(f) forming a backgate region in said N-well defined at the surface of said N-well by the sidewall of said gate;
(g) forming a sidewall on said gate;
(h) forming a source region in said N-well defined at the surface of said N-well by the sidewall on said gate; and
(i) forming a drain region in said N-well.

12. The method of claim 11 wherein said sidewall formed in step (g) is silicon oxide.

13. The method of claim 12 wherein said gate is polysilicon.

14. The method of claim 11 wherein said sidewall formed in step (g) is polysilicon insulatingly spaced from said gate.

15. The method of claim 14 wherein said gate is polysilicon.

16. The method of claim 11 wherein said gate is polysilicon.

17. A method of making a DMOS transistor, comprising the steps of:
(a) providing a first P-type layer;
(b) forming an N+ region at a surface of said first P-type layer;
(c) forming an N-well overlying said first P-type layer and said N+ region containing said DMOS transistor;
(d) forming said DMOS transistor in said N-well comprising the steps of:
(e) forming a gate insulatingly spaced from said N-well;
(f) forming a backgate region in said N-well;
(g) forming a source region in said N-well;
(h) forming a drain region in said N-well, said source and drain regions defining a channel therebetween; and
(i) forming further N+ regions in said N-well extending to the surface of said N-well forming p-n junctions with said source and gate regions, said p-n junctions remote from said channel.

18. A method as set forth in claim 17 wherein said gate is polysilicon.

19. A method of making a DMOS transistor, comprising the steps of:
(a) providing a first P-type layer;
(b) forming an N+ region at a surface of said first P-type layer;
(c) forming an N-well overlying said first P-type layer and said N+ region;
(d) forming said DMOS transistor in said N-well comprising the steps of:
(e) forming a gate insulatingly spaced from said N-well;
(f) forming a backgate region in said N-well defined at the surface of said N-well by the sidewall of said gate;
(g) forming a sidewall on said gate;
(h) forming a source region in said N-well defined at the surface of said N-well by the sidewall on said gate;
(i) forming a drain region in said N-well, said source and drain defining a channel in said N-well; and
(j) forming further N+ regions in said N-well extending to the surface of said N-well forming p-n junctions with said source and gate regions, said p-n junctions remote from said channel.

20. A method as set forth in claim 19 wherein said sidewall formed in step (g) is silicon oxide.

21. The method as set forth in claim 20 wherein said gate is polysilicon.

22. A method as set forth in claim 19 wherein said sidewall formed in step (g) is polysilicon.

23. The method as set forth in claim 22 wherein said gate is polysilicon.

24. The method as set forth in claim 19 wherein said gate is polysilicon.

25. A method of forming an integrated circuit comprising PMOS, NMOS, DMOS and bipolar transistors, comprising the steps of:
(a) providing a first P-type layer;
(b) forming spaced apart N+ regions at a surface of said first P-type layer with a relatively slow diffusing species, each said N+ region corresponding with one of said PMOS, DMOS and bipolar transistor;
(c) depositing a relatively fast diffusing N-type dopant at said regions at said surface;
(d) forming a second P-type layer overlying said first P-type layer and said N+ regions, said second P-type layer containing an NMOS transistor; and
(e) forming spaced apart N-well regions, one of said N-well region containing said PMOS transistor, one said N-well region acting as a collector region for said bipolar transistor and one said region containing said DMOS transistor.

26. A method of forming an integrated circuit as set forth in claim 25, further including providing a P+ type substrate adjacent said first P-type layer and remote from said N+ regions at the surface of said P-type layer.

27. A method of forming an integrated circuit as set forth in claim 26 further including providing in said region containing said DMOS transistor a pair of spaced apart regions doped with a P-type impurity and a gate electrode extending over each of said regions having a P-type impurity, said gate electrode further including a sidewall oxide thereon.

28. A method of forming an integrated circuit as set forth in claim 27 further including forming a region doped with an N-type impurity extending under said sidewall oxide in each of said spaced apart regions doped with a P-type impurity.

29. A method of forming an integrated circuit as set forth in claim 28 wherein one of said spaced apart regions doped with a P-type impurity extends sufficiently into said N-well region associated therewith to form an isolating PN junction to isolate said DMOS transistor from the adjacent transistor.

30. A method of forming an integrated circuit as set forth in claim 27 wherein one of said spaced apart regions doped with a P-type impurity extends sufficiently into said N-well region associated therewith to form an isolating PN junction to isolate said DMOS transistor from the adjacent transistor.

31. A method of forming an integrated circuit as set forth in claim 25 further including providing in said region containing said DMOS transistor a pair of spaced apart regions doped with a P-type impurity and a gate electrode extending over each of said regions having a P-type impurity, said gate electrode further including a sidewall oxide thereon.

32. A method of forming an integrated circuit as set forth in claim 31 further including forming a region doped with an N-type impurity extending under said sidewall oxide in each of said spaced apart regions doped with a P-type impurity.

33. A method of forming an integrated circuit as set forth in claim 31 wherein one of said spaced apart regions doped with a P-type impurity extends sufficiently into said N-well region associated therewith to form an isolating PN junction to isolate said DMOS transistor from the adjacent transistor.

34. A method of forming an integrated circuit as set forth in claim 32 wherein one of said spaced apart regions doped with a P-type impurity extends sufficiently into said N-well region associated therewith to form an isolating PN junction to isolate said DMOS transistor from the adjacent transistor.

* * * * *